United States Patent
Koller et al.

(10) Patent No.: US 10,029,913 B2
(45) Date of Patent: Jul. 24, 2018

(54) REMOVAL OF A REINFORCEMENT RING FROM A WAFER

(71) Applicant: Infineon Technologies AG, Neubiberg (DE)

(72) Inventors: Adolf Koller, Regensburg (DE); Bernhard Drummer, Tegernheim (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 15/613,666

(22) Filed: Jun. 5, 2017

(65) Prior Publication Data
US 2017/0349432 A1   Dec. 7, 2017

(30) Foreign Application Priority Data
Jun. 6, 2016  (DE) .................. 10 2016 110 378

(51) Int. Cl.
*B81C 1/00*   (2006.01)
*B81B 7/00*   (2006.01)

(52) U.S. Cl.
CPC ........ *B81C 1/00825* (2013.01); *B81B 7/0016* (2013.01)

(58) Field of Classification Search
CPC .................... B81C 1/00825; B81B 7/0016
See application file for complete search history.

(56) References Cited

U.S. PATENT DOCUMENTS

| | | |
|---|---|---|
| 2009/0186465 A1 | 7/2009 | Fujisawa et al. |
| 2011/0018116 A1 | 1/2011 | Feng |
| 2013/0196457 A1 | 8/2013 | Nakajima et al. |
| 2013/0313661 A1 | 11/2013 | Grille et al. |
| 2014/0220765 A1 | 8/2014 | Nakajima |
| 2016/0155656 A1 | 6/2016 | Matsumura |
| 2016/0293473 A1* | 10/2016 | Yoshihara ........... H01L 21/6836 |

FOREIGN PATENT DOCUMENTS

| | | |
|---|---|---|
| DE | 10 2011 078 726 | 1/2012 |
| DE | 10 2012 004 373 | 7/2014 |
| DE | 10 2015 201 833 | 8/2015 |

* cited by examiner

*Primary Examiner* — John P Dulka
(74) *Attorney, Agent, or Firm* — Dicke, Billig & Czaja, PLLC (57) ABSTRACT

A method of removing a reinforcement ring from a wafer is described. The method includes forming a ring-shaped recess in a first surface of the wafer and separating the reinforcement ring from an inner region of the wafer along the ring-shaped recess.

21 Claims, 6 Drawing Sheets

REMOVAL OF A REINFORCEMENT RING FROM A WAFER

CROSS-REFERENCE TO RELATED APPLICATION

This Utility Patent Application claims priority to German Patent Application No. 10 2016 110 378.0, filed Jun. 6, 2016, which is incorporated herein by reference.

BACKGROUND

This disclosure relates in general to the technique of wafer processing, and more particularly to the technique of separating a ring-shaped reinforcement part from the wafer. Wafer handling is a challenging task, in particular if the wafer has a large diameter, is small in thickness or includes micromechanical structures which are shock-sensitive and/or may reduce the stability of the wafer. Inadvertent wafer damage or wafer fragmentation may cause a significant loss in production yield and reduces the cost efficiency of the overall manufacturing process. On the other hand, overly cautious wafer handling is costly and time consuming. Hence, safe, cost-effective and reliable wafer handling is a key aspect in modern wafer processing technology.

SUMMARY

Various embodiments pertain to a method of removing a reinforcement ring from a wafer. The method may include forming a ring-shaped recess in a first surface of the wafer; and separating the reinforcement ring from an inner region of the wafer along the ring-shaped recess.

Various embodiments pertain to a wafer, the wafer including a reinforcement ring extending along a periphery of the wafer. The wafer may further include a ring-shaped recess in a first surface of the wafer and a usable area of the wafer surrounded by the ring-shaped recess. An inner periphery of the ring-shaped recess neighbors the usable area of the wafer.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following detailed description, reference is made to the accompanying drawings, which form a part thereof, and in which is shown by way of illustration specific embodiments in which the invention may be practiced. In this regard, directional terminology, such as "top", "bottom", "front", "back", "upper", "lower", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other unless specifically noted otherwise.

Further, as employed in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the above-mentioned or similar terms may, optionally, also have the specific meaning that the elements or layers are directly contacted together, i.e. that no intervening elements or layers are provided between the "bonded", "attached", "connected", "coupled" and/or "electrically connected/electrically coupled" elements, respectively.

Further, the word "over" used with regard to a part, element or material layer formed or located "over" a surface may be used herein to mean that the part, element or material layer be located (e.g. placed, formed, deposited, etc.) "indirectly on" the implied surface with one or more additional parts, elements or layers being arranged between the implied surface and the part, element or material layer. However, the word "over" used with regard to a part, element or material layer formed or located "over" a surface may also have the specific meaning that the element or material layer be located (e.g. placed, formed, deposited, etc.) "directly on", e.g. in direct contact with, the implied surface. The same applies analogously to the terms "under", "below", "beneath", etc.

The wafer described herein may be of various materials, among them crystalline, polycrystalline or amorphous materials. By way of example, the wafer may be of a semiconductor material, such as, e.g., Si, SiC, SiGe, GaAs, GaN, AlGaN, InGaAs, InAlAs, etc, and, furthermore, may contain inorganic and/or organic materials that are not semiconductors.

The term "wafer" as used in this disclosure may have a broad meaning. It may, e.g., denote a monocrystalline, polycrystalline or amorphous plate of a semiconductor material. Such bulk semiconductor wafers are known to be used in semiconductor device fabrication. Further, the term "wafer" may refer to a multi-layer structure or stacked structure using one or more semiconductor plates and, e.g., one or more insulating material plates (e.g. glass plates) bonded together to provide a multi-layer structure. It is to be noted that the wafer may be processed by typical wafer processing steps used in wafer processing technologies, e.g. doping, depositing insulating layers, depositing conducting layers, structuring insulating or conducting layers, etc.

The wafer may comprise integrated circuits (IC) and/or microelectromechanical structures (MEMS) formed at least in one of its main surfaces. After wafer processing for generating the ICs and/or MEMSs, the semiconductor wafer is divided into single chips (dies).

The wafer may comprise bonding pads (chip electrodes) to allow electrical contact to be made with the ICs or MEMSs included in the wafer. The bonding pads may include one or more metal layers which are applied to the semiconductor material of the wafer. The metal layers may be manufactured with any desired geometric shape and any desired material composition. The metal layers may, for example, be in the form of a layer or land covering an area. By way of example, any desired metal capable of forming a solder bond or diffusion solder bond, for example Cu, Al, Au, Ni, AlCu, NiSn, Ag, Pt, Pd, In, Sn, and an alloy of one or more of these metals may be used as the material. The metal layers need not be homogenous or manufactured from just one material, that is to say various compositions and concentrations of the materials contained in the metal layers are possible.

The integrated circuits (ICs) described herein may be of different type and may include, for example, monolithic integrated electrical, electro-optical or electro-mechanical circuits or passives. The integrated circuits may, for example, be designed, e.g., as logic integrated circuits, analog integrated circuits, mixed signal integrated circuits, power integrated circuits, memory circuits, level shifters, drivers, microcontrollers, batteries or integrated passives such as, e.g., so-called PID (passive integrated device).

The wafer described herein may further include MEMSs. The MEMSs may be of different type and may include, for example, holes, recesses, membranes, cantilevers or other resilient, rotatable or displaceable micromechanical elements. By way of example, the MEMSs may form a microphone, an acceleration sensor, a position sensor, a pressure sensor, a gas sensor, a speaker, etc.

Figure 1:
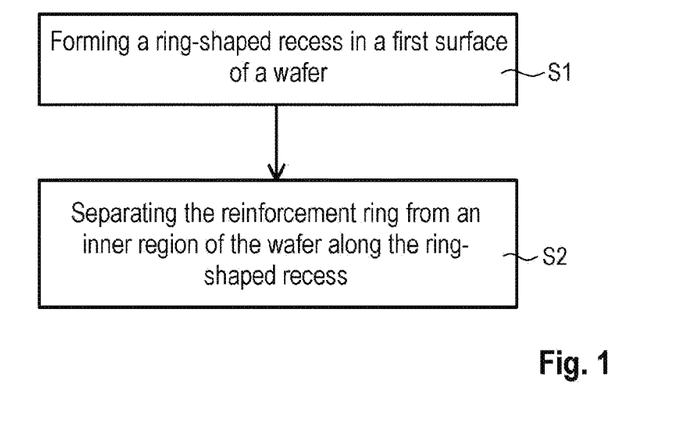
FIG. 1 is a flowchart of an exemplary method of removing a reinforcement ring from a wafer.

FIG. 1 illustrates an exemplary method of removing a reinforcement ring from a wafer. At S1, a ring-shaped recess is formed in a first surface of the wafer. This recess may decrease the remaining thickness of the wafer to a value which allows an easy separation of the reinforcement ring from the wafer by a subsequent reinforcement ring removal processes. Further, the recess may create a spacing between a dicing tape e.g. covering the first surface of the wafer and the recessed wafer material. The spacing may protect the dicing tape from damage which otherwise could occur during separating the reinforcement ring from the wafer during reinforcement ring removal.

At S2, the reinforcement ring is separated from an inner region of the wafer along the ring-shaped recess. Separating of the reinforcement ring may be performed by using conventional wafer processing techniques such as wafer processing techniques used for generating MEMS structures (e.g. holes, recesses, membranes, cantilevers, etc.) in the wafer.

FIGS. 2A-2D illustrate cross-sectional views of stages of an exemplary process of generating a reinforcement ring and a ring-shaped recess on a wafer in accordance with various embodiments.

Figure 2A:
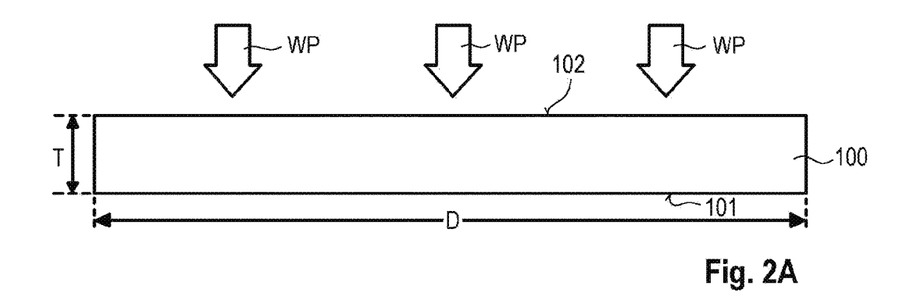
FIGS. 2A-2D illustrate cross-sectional views of stages of an exemplary process of generating a reinforcement ring and a ring-shaped recess on a wafer in accordance with various embodiments.

FIG. 2A illustrates a semiconductor wafer 100. The semiconductor wafer 100 has a first surface 101 and a second surface 102 opposite the first surface 101. The semiconductor wafer 100 may be of any semiconductor material, e.g. the semiconductor materials mentioned above. The semiconductor wafer 100 may, e.g., be made of a monocrystalline semiconductor material.

The semiconductor wafer may have a disc-like shape. The diameter of the semiconductor wafer may, e.g., be equal to or greater than 200 mm, 220 mm, 240 mm, 260 mm, 280 mm, 300 mm, 320 mm, 340 mm, 360 mm, 380 mm, or 400 mm. The thickness T of the semiconductor wafer 100 may be equal to or greater than 200 µm, 300 µm, 400 µm 500 µm, 600 µm, 700 µm, 800 µm, 900 µm, or 1000 µm. The semiconductor wafer 100 may be made of a bulk semiconductor material or may, e.g. be made of a multi-layer structure comprising at least one layer of semiconductor material.

The semiconductor wafer 100 may be subjected to (frontend) semiconductor wafer processing. Semiconductor wafer processing may include the generation of integrated circuits (ICs) in the second surface 102 of the semiconductor wafer 100. The second surface 102 of the semiconductor wafer 100 may thus be referred to as the front side of the semiconductor wafer 100. Wafer processing may include doping, oxide layer forming, metallization layer forming, layer structuring and any other process known in semiconductor technology to form integrated circuits such as, e.g., micro-controllers, memories, logic circuits, etc. Wafer processing is schematically indicated in FIG. 2A by arrows WP.

Figure 2B:
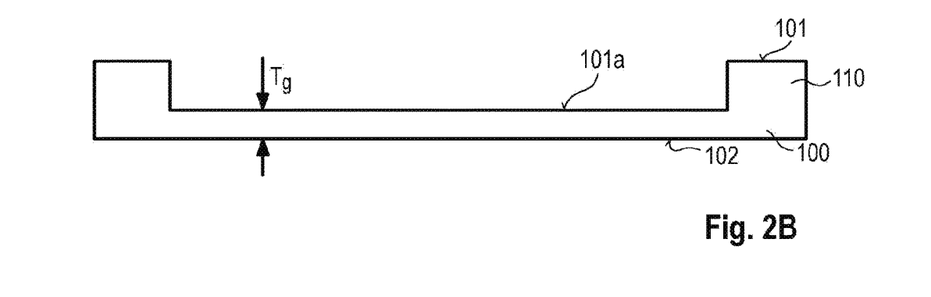

The wafer 100 may then optionally be flipped and a reinforcement ring 110 may be formed. FIG. 2B illustrates the semiconductor wafer 100 after the reinforcement ring 110 has been formed at the wafer 100. The reinforcement ring 110 may be formed, e.g., by thinning the first surface 101 (backside) of the wafer anywhere except at a peripheral ring-shaped region. This peripheral ring-shaped region then forms the reinforcement ring 110 of the wafer 100.

Before thinning the wafer 100, a protective layer (not shown) may be applied to the second surface 102 (front side) of the wafer 100 to protect the (e.g. already processed) front side of the wafer 100 during the thinning process.

The reinforcement ring 110 adds stability and rigidity to the wafer 100. The reinforcement ring 110 allows the wafer 100 to be handled or manipulated at a much lower risk of damage than without reinforcement ring 110 (and same thickness as generated by thinning). The reinforcement ring 110 is also known in the art as a TAIKO-ring (registered trademark) in the art. Analogously, a wafer 100 having an inner thinned region and a peripheral reinforcement ring 110 is often referred to as a TAIKO-wafer in the art.

The reinforcement ring 110 may have the same thickness T as the initial wafer 100. A thinned region 101a subjected to the thinning process may have a substantial smaller thickness Tg. The thickness Tg may be equal to or greater than or less than 150 µm, 200 µm, 250 µm, 300 µm, 350 µm, 400 µm, 450 µm, or 500 µm.

A maximum lateral dimension L of the reinforcement ring 110 may be equal to or greater 1 mm, 2 mm, 3 mm, 4 mm, 5 mm, 6 mm, 7 mm, 8 mm, 9 mm, or 10 mm. It is to be noted that the reinforcement ring 110 may have but does not need to have a (top view) circular shape. By way of example, it also may have a polygonal shape or any other suitable shape. L may thus denote the maximum lateral dimension of the reinforcement ring 110.

The reinforcement ring 110 may, e.g., continuously surround the thinned region 101a of the wafer 100. That is, the reinforcement ring 110 may be a closed ring structure, i.e. a ring structure without any interruptions or gaps dividing the ring into several spaced-apart segments.

The thinning of the wafer 100 in the thinned region 101a may, e.g., be performed by grinding the backside (first surface 101) of the wafer 100. Wafer grinding is known in the art and a detailed description thereof can therefore be omitted.

It is to be noted that the reinforcement ring 110 has to be removed from the thinned inner region 101a of the wafer 100 at a later stage of the manufacturing process. Removal of a reinforcement ring 110 may be difficult or even impossible if the thickness Tg of the thinned region 101a is equal to or greater than a certain limit. The following disclosure, inter alia, points out approaches to safely remove the reinforcement ring 110 from the wafer 100.

Figure 2C:
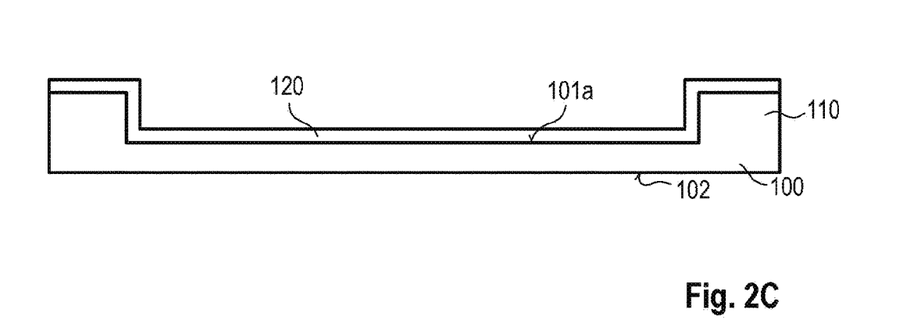

Referring to FIG. 2C, a resist 120 may be applied onto a part or the entirety of the first surface 101, and in particular onto the thinned region 101a thereof.

Figure 2D:
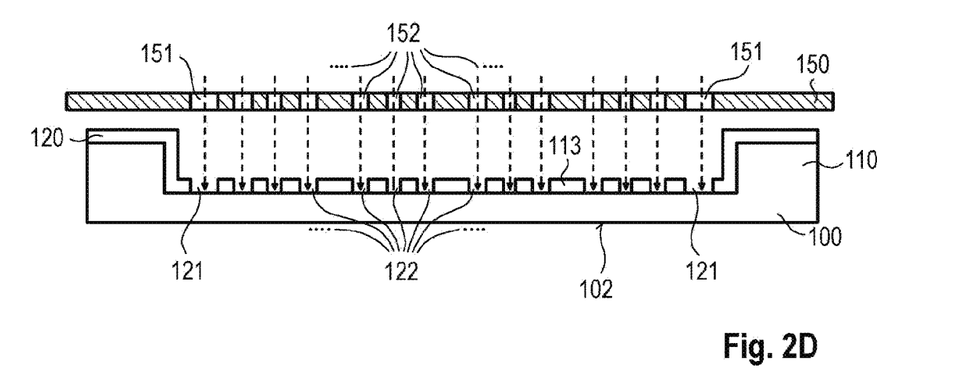

Referring to FIG. 2D, a pattern may be formed in the resist 120 by performing a patterning process. By way of example, a photomask 150 may be positioned over the first surface 101 of the wafer 100 and is aligned with the position of the wafer 100. The photomask 150 may be provided with a ring-shaped opening 151 designed in accordance with the shape of a ring-shaped recess to be formed in the first surface 101 (or, more particularly, in the thinned region 101a) of the wafer 100. The photomask 150 may optionally be further equipped with openings 152 of a shape commensurate with a desired shape of circuit structures to be formed in the first surface 101 (or, more particularly, in the thinned region 101a) of the wafer 100. The circuit structures to be formed in the first surface 101 may, e.g., be MEMS structures such as, e.g., holes, recesses, membranes, cantilevers or other resilient, rotatable or displaceable micromechanical elements.

Then, exposure and development may be performed to transfer the mask pattern of the photomask 150 to the first surface 101 of the wafer 100. Openings 122 corresponding in shape to the openings 152 of the photomask 150 are formed in the resist 120. Further, a ring-shaped opening 121 corresponding in shape to the ring-shaped opening 151 of the photomask 150 is formed in the resist 120.

As an alternative to the above-described process of using the same photomask 150 for generating the ring-shaped opening 121 and the openings 122 (for producing the circuit structures) it is also possible to use different photomasks 150. Further, it is possible to generate the openings 122 by a stepper process in which exposure of the resist 120 to produce the openings 122 is performed sequentially across a set of partial zones of the thinned region 101a of the first surface 101. However, using a common photomask 150, as described above, may facilitate the alignment step and may reduce the process time needed for the overall patterning process.

After patterning of the resist 120, the ring-shaped recess (not shown in FIG. 2D) and, e.g., the circuit structures (if any) will be formed in the first surface 101 of the wafer 100. The formation of the ring-shaped recess may be performed by an etching process. The formation of the circuit structures (not shown in FIG. 2D) may also be performed by an etching process. It is to be noted that both the ring-shaped recess and the circuit structures may be formed by the same or subsequent etching process(es).

Alternatively, it is possible that the ring-shaped recess is generated by any other (direct) process such as, e.g., milling (i.e. recess-grinding), laser ablation, etc. If a mechanical wafer machining process is used, the formation of the ring-shaped recess should be performed before generating the circuit structures (not shown in FIG. 2D) in the wafer 100 in order to avoid any risk of damaging the circuit structures by vibrations, concussions, grinding fluids, chemical agents or other environmental impact caused by wafer machining.

Figure 3A:
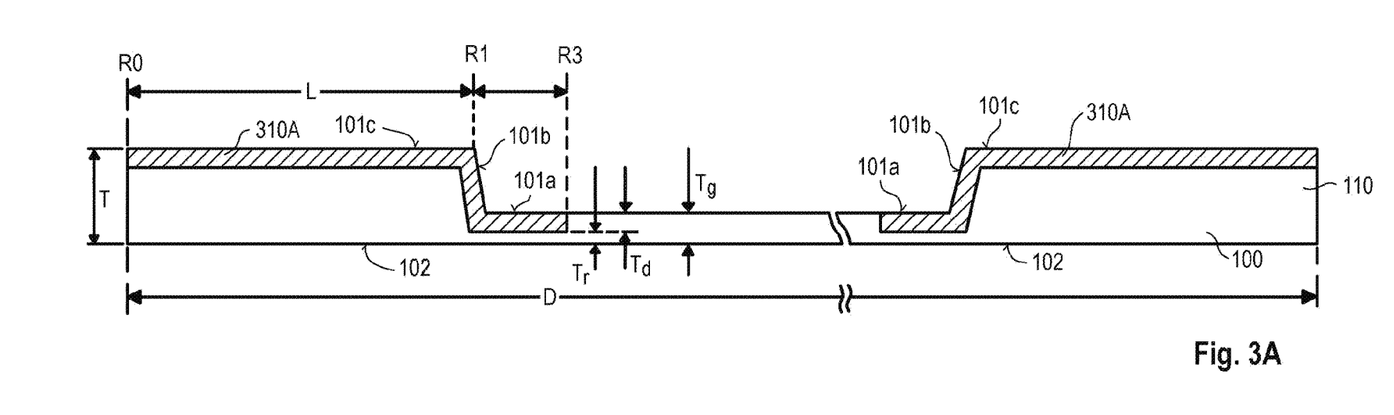
FIGS. 3A and 3B illustrate cross-sectional close up views of different types of ring-shaped recesses to be formed in a wafer in accordance with various embodiments.
Figure 3B:
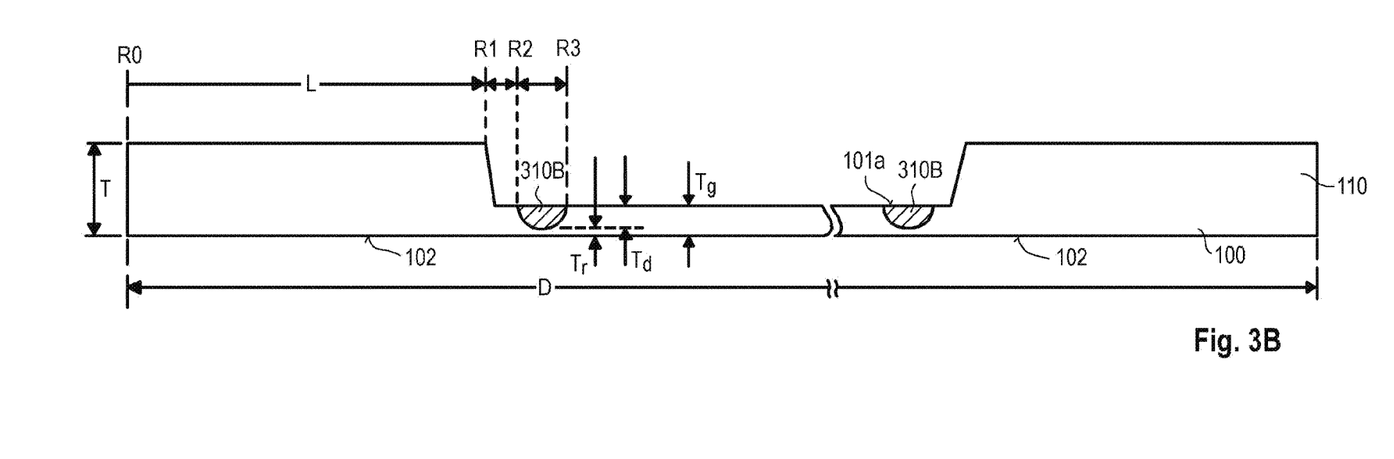

FIGS. 3A and 3B illustrate in a more detailed representation (in which a central portion of the wafer is omitted for the sake of illustrative ease) two different types of a ring-shaped recess to be formed in the wafer 100. The hatched areas of the wafer 100, as depicted in FIGS. 3A and 3B, illustrate wafer material which is to be removed when the ring-shaped recess 310A, 310B is formed.

According to FIG. 3A, the ring-shaped recess 310A may extend across a peripheral part of the thinned region 101a, along, e.g., a side wall 101b of the thinned region 101a and over a surface 101c of the reinforcement ring 110. That is, the ring-shaped recess 310A may have the shape of a continuous, circumferential ring which extends in a radial direction between an edge of the wafer 100 at R0 and R3 within the thinned region 101a of the first surface 101. R1 refers to the radial position of the side wall 101b before thinning.

Referring to FIG. 3B, the ring-shaped recess 310B may have the shape of a ring-shaped trench. The ring-shaped trench 310B may extend in a radial direction between R3 (i.e. the inner outline of the ring-shaped trench 310B) and R2 (i.e. the outer outline of the ring-shape trench 310B). R2 and R3 are measured at the level of the first surface 101 of the wafer 100 after thinning, i.e. at the level of the surface of the thinned region 101a. It is to be noted that Referring to FIGS. 3A and 3B, the distance between R1 and R3 (i.e. between an outline of the thinned region 101a and an inner outline of the ring-shaped recess 310A, 310B) may be equal to or less than 100 µm, 200 µm, 400 µm, 600 µm, 800 µm, 1000 µm, 1200 µm, 1400 µm, 1600 µm, 1800 µm, or 2000 µm. The distance between R1 and R2 (i.e. between the outline of the thinned region 101a and the outer outline of the ring-shaped trench 310B) may be equal to or less than 100 µm, 200 µm, 300 µm, 400 µm, 500 µm, 600 µm, 700 µm, 800 µm, 900 µm, or 1000 µm. The ring-shaped trench 310B may thus have a width (distance between R2 and R3) of equal to or less than or greater than 100 µm, 200 µm, 300 µm, 400 µm, 500 µm, 600 µm, 700 µm, 800 µm, 900 µm, or 1000 µm. The reinforcement ring 110 may have a width L (distance between R0 and R1) as already mentioned above. The thickness of the reinforcement ring 110 may, e.g., be equal to the thickness T of the initial wafer 110 as already mentioned above or may, e.g., be the thickness T reduced by the depth Td of the ring-shaped recess 310A (e.g. see FIG. 3A).

The ring-shaped recess 310A, 310B may have a depth Td of equal to or greater than 50 µm, 100 µm, 150 µm, 200 µm, 250 µm, 300 µm, 350 µm, 400 µm, 450 µm, 500 µm, 550 µm, 600 µm, 650 µm, or 700 µm. The wafer 100 may have a thickness Tg in the thinned region 101a of equal to or greater than 100 µm, 200 µm, 300 µm, 400 µm, 500 µm, 600 µm, 700 µm, or 800 µm. The wafer 100 may have a residual thickness Tr as measured between the second surface 102 of the wafer 100 and the bottom of the ring-shaped recess 310A, 310B of, e.g., equal to or less than 60 μm, 80, μm 100 μm, 120 μm, 140 μm, 160 μm, 180 μm, or 200 μm.

By way of example, if Tg is about 250-400 μm, Td may be about 75-325 μm (±25 μm) so as to provide for a residual wafer thickness Tr of, e.g., 75-175 μm (±25 μm). The residual wafer thickness Tr should be small enough to allow the reinforcement ring 110 to be easily separated from an inner region of the wafer comprised in the thinned region 101a.

Figure 4A:
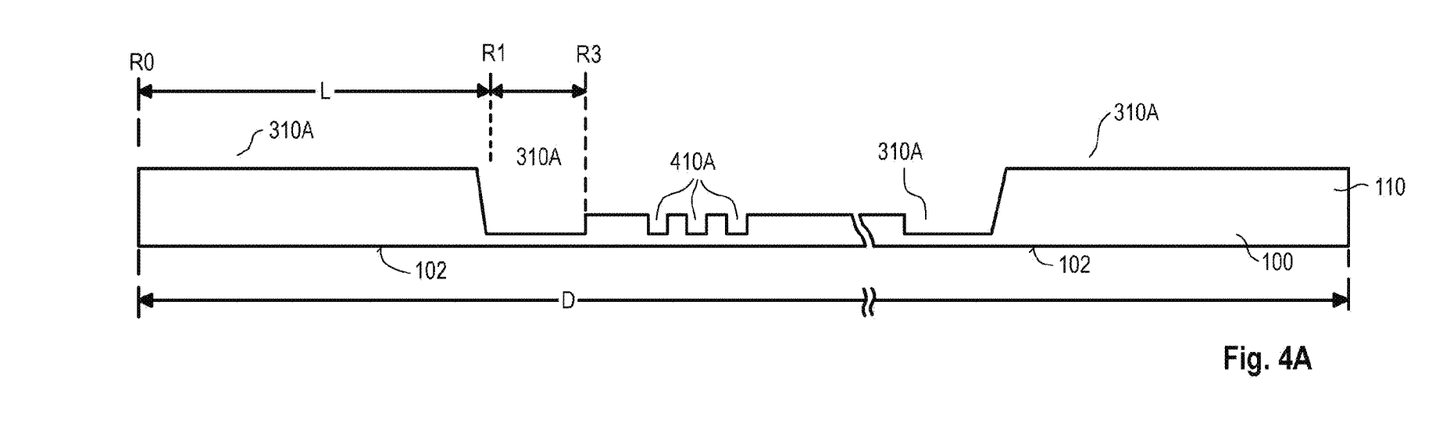
FIGS. 4A and 4B illustrate cross-sectional close up views of a wafer showing the formation of the two types of ring-shaped recesses as shown in FIGS. 3A and 3B, respectively.
Figure 4B:
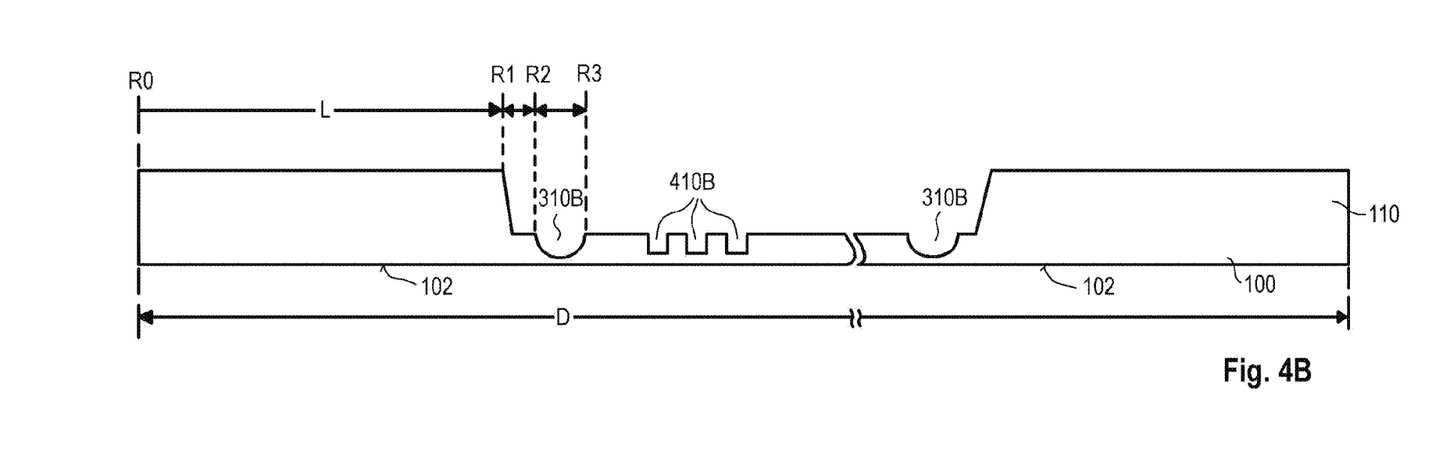

FIGS. 4A and 4B illustrate embodiments of a wafer 100 including a reinforcement ring 110 extending along a periphery of the wafer 100 in correspondence to FIGS. 3A and 3B, respectively. Thus, the wafer 100 is equipped with a ring-shaped recess 310A, 310B in the first surface 101 and further includes a usable area surrounded by the ring-shaped recess 310A, 310B, wherein the inner outline (at R3) of the ring-shaped recess 310A, 310B neighbors the usable area of the wafer 100.

FIGS. 4A, 4B further illustrate circuit structures 410A, 410B optionally formed in the first surface 101 of the usable area of the wafer 100. The circuit structures 410A, 410B may have been formed in accordance with the description of FIG. 2D. The circuit structures 410A, 410B may represent MEMS structures as used in a MEMS device, e.g. in any of the above-mentioned MEMS devices. The second surface 102 of the wafer may, e.g., comprise ICs (not shown) within the usable area of the wafer 100. As apparent from FIGS. 3A, 3B and 4A, 4B the usable area of the wafer (i.e. the area between R3-R3) may be a central portion of the thinned region 101a of the first surface 101.

It is to be noted that further structures such as, e.g., electrodes (e.g. chip pads) may be formed in the first surface 101 (backside) and/or the second surface 102 (front side) within the usable area of the wafer 100. Such electrodes (not shown) may, e.g., be electrically connected to the MEMS structures and/or to the ICs.

Figure 5A:
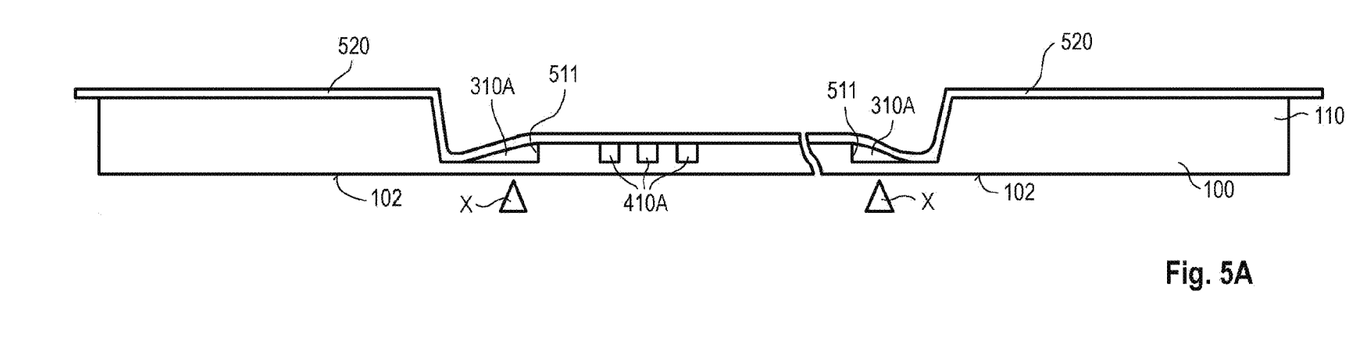
FIGS. 5A and 5B illustrate cross-sectional close up views of a wafer showing the attachment of a dicing tape on the two types of ring-shaped recesses as shown in FIGS. 3A and 3B, respectively.
Figure 5B:
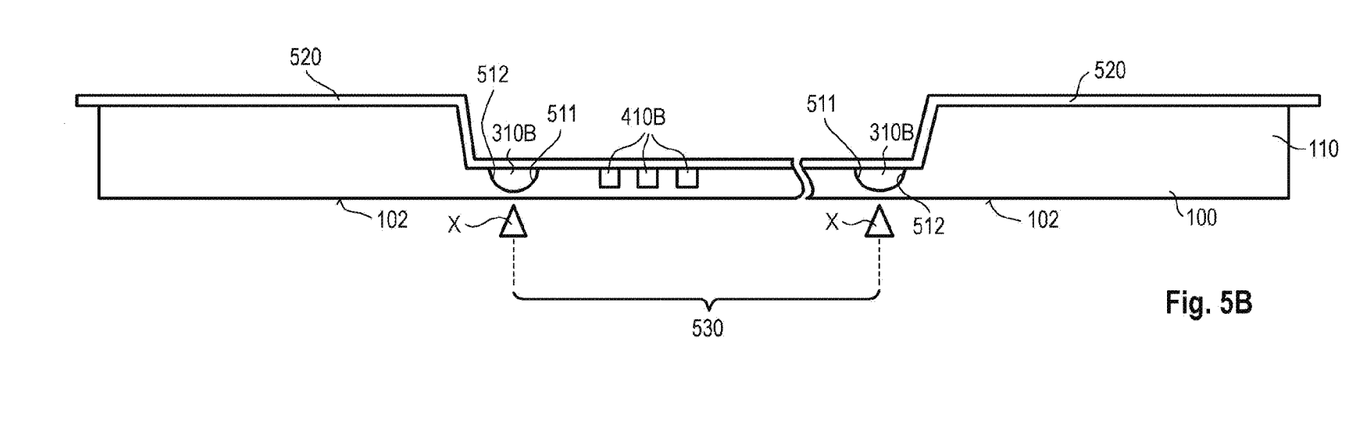

Referring to FIGS. 5A and 5B, a dicing tape 520 may be attached to the first surface 101 of the wafer 100. As can be seen in FIGS. 5A and 5B, the dicing tape 520 may be spaced-apart from at least a part of the first surface 101 within the ring-shaped recess 310A, 310B. More specifically, in case of the first type of the ring-shaped recess 310A, the dicing tape 520 may be distant from the bottom of the ring-shaped recess 310A at a location near an inner edge region 511 of the ring-shaped recess 310A. Referring to FIG. 5B, the dicing tape 520 may be spaced apart from the first surface 101 of the wafer 100 across the entire extension of the second type ring-shaped recess 310B, i.e. may span over the ring-shaped trench 310B from the inner edge region 511 to an outer edge region 512 of the ring-shaped trench 310B.

Then, the reinforcement ring 110 is separated from an inner region 530 of the wafer 100 (which includes the usable area of the wafer 100) along the ring-shaped recess 310A, 310B. More specifically, the separation may be performed at arrow X. The separation may be performed at a location where the dicing tape 520 is spaced apart from the first surface 101 of the wafer 100. By way of example, the separation may be performed near to the inner edge region 511 of the ring-shaped recess 310A and/or near to the center of the ring-shaped trench 310B.

The separation of the reinforcement ring 110 from the inner region 530 of the wafer 100 may be performed by ablation laser cutting. More specifically, a ring-shaped, e.g. circular, ablation laser cut may be applied at arrow X. The ablation laser may be a UV laser. Using an ablation laser is beneficial for avoiding the use of milling or grinding fluids, etching agents or other substances which could harm circuit structures (e.g., MEMS structures) of the wafer 100. However, other separation methods may also be feasible, e.g., etching, milling (i.e. separation-grinding), etc. These processes may similarly provide for a ring cut at arrow X.

Due to the distance between the cut wafer material and the dicing tape 520, the separation process can be performed without severely damaging the dicing tape 520. In other words, the dicing tape 520 may remain intact at the location of separation. By way of example, if an ablation laser is used to separate the reinforcement ring 110 from the inner region 530 of the wafer 100, the laser is out of focus when hitting the dicing tape 520. That way, the laser causes small or negligible damage to the dicing tape 520, and it is therefore possible to use a variety of dicing tapes 520, e.g. dicing tapes which are not specifically designed for ablation laser cutting.

By way of example, it is possible to use a dicing tape 520 which is designed for stealth (laser) dicing. Stealth dicing may be one of the favourable dicing methods used to ultimately separate chips out of the inner region 530 of the wafer 100. Stealth dicing is different from ablation laser cutting, i.e. different lasers may be employed. Since stealth dicing does not produce kerf between adjacent chips to be separated, the stealth laser dicing tape 520 has to be expandable. Such stealth laser dicing tape 520 (or other dicing tapes) are typically prone to foil damage if hit by an ablation laser as used for reinforcement ring 110 separation. Therefore, the distance between the dicing tape 520 and the location where the reinforcement ring 110 is separated from the inner region 530 of the wafer 100 allows, e.g., the usage of a dicing tape 520 which is specifically fitted to the later wafer dicing process (i.e. the process to produce the chips).

Figure 6A:
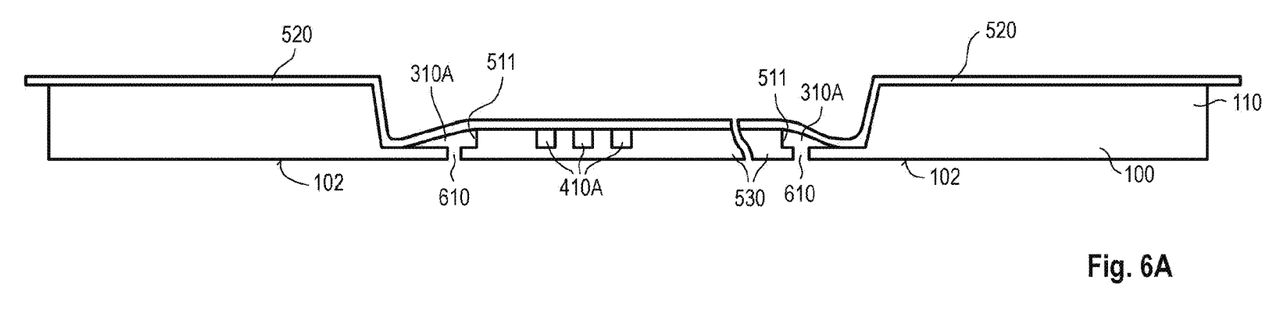
FIGS. 6A and 6B illustrate cross-sectional close up views of a wafer showing the separation of the reinforcement ring from an inner region of the wafer along the ring-shaped recess.
Figure 6B:
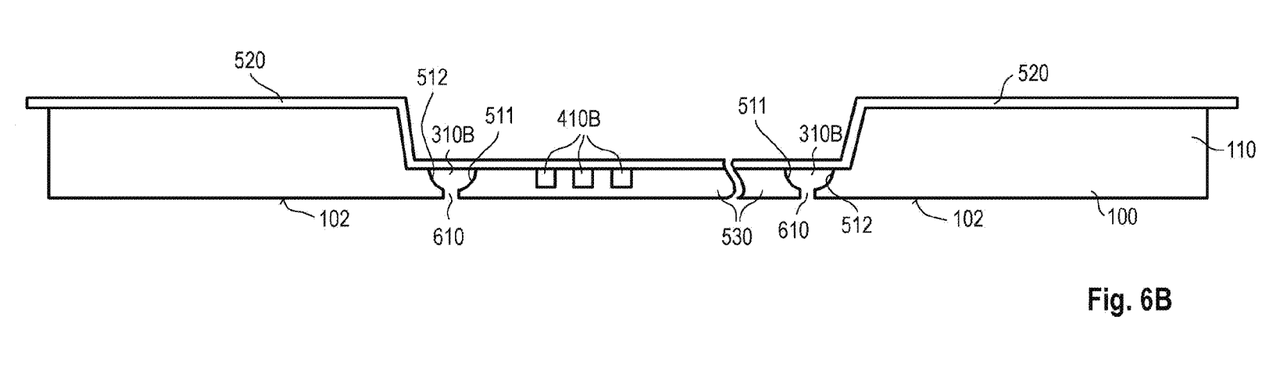

FIGS. 6A and 6B illustrate the wafer 100 when the inner region 530 of the wafer 100 is separated from the reinforcement ring 110 at a ring-shaped opening 610. The ring-shaped opening 610 extends along and opens into the ring-shaped recess 310A and 310B, respectively. The dicing tape 520 remains intact at the location of separation. Thus, the wafer 100 can still be securely handled after the separation of the reinforcement ring 110. On the other hand, the reduction of the material thickness at the location of separation by the ring-shaped recess 310A, 310B significantly mitigates the difficulties and risks in connection with the separation of the reinforcement ring 110. This does specifically apply for the separation of the reinforcement ring 110 for large wafers such as, e.g., 12" wafers, where the reinforcement ring separation is much more difficult than for smaller wafers such as, e.g., 8" wafers, because larger wafers are more fragile than smaller wafers.

Further, the process described herein may significantly facilitate the separation of the reinforcement ring 110 for wafers 100 of a relatively large thickness Tg of equal to or more than 200 μm and/or of wafers 100 which include sensitive structures. In particular, both these aspects often apply to MEMS structures, so that the disclosure herein may be used with particular advantage for MEMS wafers and the manufacturing of MEMS devices.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of processing a wafer including removing a reinforcement ring from the wafer, the method comprising:
    forming a ring-shaped recess in a first surface of the wafer, the ring-shaped recess extending partially through a thickness of the wafer from the first surface toward an opposing second surface so as to leave a remaining thickness; and
    separating the reinforcement ring from an inner region of the wafer along the ring-shaped recess by removing, in alignment with the ring-shaped recess, the remaining thickness of the wafer via the second side.

2. The method of claim 1, wherein the ring-shaped recess is formed by one or more of etching, milling, and laser ablation.

3. The method of claim 1, wherein the reinforcement ring is separated by one or more of laser ablation, etching, and milling.

4. The method of claim 1, further comprising:
    forming the reinforcement ring is performed by thinning the first surface of the wafer in a thinned region which comprises the inner region of the wafer.

5. The method of claim 4, wherein a distance between an outline of the thinned region and an inner periphery of the ring-shaped recess is equal to or less than 2000 micrometer.

6. The method of claim 1, wherein the ring-shaped recess is a ring-shaped trench.

7. The method of claim 6, wherein a distance between an outline of the thinned region and an outer periphery of the ring-shaped trench is equal to or less than 1000 micrometer.

8. The method of claim 6, wherein the ring-shaped trench has a width of equal to or less than 1000 micrometer when measured at the level of the first surface of the wafer.

9. The method of claim 1, wherein the thickness of the wafer in the inner region is equal to or greater than 100 micrometer.

10. The method of claim 1, wherein the ring-shaped recess has a depth relative to the first surface of the inner region of the wafer of equal to or greater than 50 micrometer.

11. The method of claim 1, wherein the wafer has a residual thickness measured between the second surface of the wafer and the bottom of the ring-shaped recess of equal to or less than 200 micrometer.

12. The method of claim 1, wherein the reinforcement ring has a thickness equal to or greater than 200 micrometer.

13. The method of claim 1, further comprising:
    generating an etch mask on the first surface of the wafer;
    etching structures into the first surface of the wafer by using the etch mask; and
    etching the ring-shaped recess into the first surface of the wafer by using the same etch mask as used for etching the structures.

14. The method of claim 1, further comprising:
    forming microelectromechanical system (MEMS) structures in the first surface of the wafer.

15. The method of claim 1, further comprising:
    attaching a dicing tape to the first surface of the wafer, wherein the dicing tape is spaced apart from the first surface of the wafer at a location where the reinforcement ring is to be separated from the inner region of the wafer.

16. The method of claim 1, wherein the ring-shaped recess has one or more edge regions of a rounded, tapered or rectangular sectional shape.

17. The method of claim 1, wherein the reinforcement ring runs along the peripheral edge of the wafer.

18. The method of claim 1, further comprising:
    forming integrated circuits in a second surface of the wafer opposite the first surface.

19. The method of claim 1, wherein the wafer comprises a semiconductor material.

20. A wafer, comprising:
    a reinforcement ring extending along a periphery of the wafer;
    a ring-shaped recess in a first surface of the wafer, the ring-shaped recess extending partially through a thickness of the wafer toward an opposing second surface of the wafer, the first surface being a backside of the wafer and the second surface being an active front side of the wafer including integrated circuits; and
    a usable area of the wafer surrounded by the ring-shaped recess, wherein an inner periphery of the ring-shaped recess neighbors the usable area of the wafer.

21. The wafer of claim 20, wherein the first surface of the wafer within the usable area comprises microelectromechanical system (MEMS) structures.

* * * * *